(12) United States Patent
Tsividis

(10) Patent No.: US 9,876,490 B2
(45) Date of Patent: Jan. 23, 2018

(54) SYSTEMS, APPARATUS, AND METHODS FOR PROVIDING CONTINUOUS-TIME SIGNAL DIFFERENTIATION AND INTEGRATION

(71) Applicant: THE TRUSTEES OF COLUMBIA UNIVERSITY IN THE CITY OF NEW YORK, New York, NY (US)

(72) Inventor: Yannis Tsividis, New York, NY (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 262 days.

(21) Appl. No.: 14/282,244

(22) Filed: May 20, 2014

(65) Prior Publication Data
US 2014/0253199 A1 Sep. 11, 2014

Related U.S. Application Data

(63) Continuation-in-part of application No. 14/082,945, filed on Nov. 18, 2013, now abandoned.

(60) Provisional application No. 61/728,530, filed on Nov. 20, 2012.

(51) Int. Cl.
*H03K 5/14* (2014.01)
*G06G 7/18* (2006.01)

(52) U.S. Cl.
CPC ...................... *H03K 5/14* (2013.01)

(58) Field of Classification Search
CPC ............ G06G 7/18; G06G 7/62; G06G 7/625; H03K 5/14
See application file for complete search history.

(56) References Cited

U.S. PATENT DOCUMENTS

| 5,173,924 | A | 12/1992 | Hiraiwa et al. |
| 5,459,422 | A * | 10/1995 | Behrin .................. H03K 5/131 327/270 |
| 5,619,154 | A | 4/1997 | Strolle et al. |
| 6,359,495 | B2 | 3/2002 | Lupia |
| 6,476,656 | B2 | 11/2002 | Dally et al. |
| 7,132,972 | B2 | 11/2006 | Tsividis |
| 7,324,028 | B2 | 1/2008 | Hsieh et al. |
| 8,412,478 | B2 * | 4/2013 | Ramond ...................... 327/336 |
| 2013/0057423 | A1 | 3/2013 | Kurchuk et al. |

OTHER PUBLICATIONS

Schell, B. and Tsividis, Y., "A Continuous-Time ADC/DSP/DAC System With No Clock and With Activity-Dependent Power Dissipation," IEEE Journal of Solid-State Circuits, vol. 43, No. 11, pp. 2472-2481 (Nov. 2008).

* cited by examiner

*Primary Examiner* — Lincoln Donovan
*Assistant Examiner* — Colleen O Toole
(74) *Attorney, Agent, or Firm* — Wilmer Cutler Pickering Hale and Dorr LLP

(57) ABSTRACT

Systems and methods for providing an approximate differentiation and integration of an input continuous-time signal are provided. The disclosed systems include a continuous-time delay block configured to receive an input continuous-time signal and to delay the input continuous-time signal by a predetermined delay factor to generate a delayed input continuous-time signal, a processing block configured to determine a difference or a sum between two continuous-time signals, and a multiplication block configured to multiply an input continuous signal to provide a multiplied input continuous signal.

11 Claims, 9 Drawing Sheets

SYSTEMS, APPARATUS, AND METHODS FOR PROVIDING CONTINUOUS-TIME SIGNAL DIFFERENTIATION AND INTEGRATION

CROSS-REFERENCE TO RELATED APPLICATIONS

This application is a continuation-in-part of and claims the benefit under 35 U.S.C. §120 of U.S. application Ser. No. 14/082,945, entitled "SYSTEMS, APPARATUS, AND METHODS FOR PROVIDING CONTINUOUS-TIME SIGNAL DIFFERENTIATION AND INTEGRATION," filed on Nov. 18, 2013, which claims benefit under 35 U.S.C. §119(e) of U.S. Provisional Patent Application No. 61/728,530, entitled "ANALOG AND DIGITAL DELAY-BASED DIFFERENTIATORS AND INTEGRATORS," filed on Nov. 20, 2012, by Tsividis, both of which are hereby incorporated by reference herein in their entirety.

FIELD OF THE DISCLOSURE

This disclosure relates to systems, apparatus, and methods for providing continuous-time signal processing.

BACKGROUND

Differentiation and integration are two important, fundamental operations in analog signal processing systems. Oftentimes, differentiation and integration operations are implemented using resistors and capacitors, usually also employing operational amplifiers. Unfortunately, these analog components can consume a large real estate in an integrated chip, thereby increasing the cost of analog signal processing systems. Furthermore, these analog components can also consume a large amount of power, which renders them inadequate for many applications, including mobile applications.

SUMMARY

Disclosed embodiments include an apparatus configured to provide an approximate differentiation of an input continuous-time signal. The apparatus can include a continuous-time delay block configured to receive the input continuous-time signal and to delay the input continuous-time signal by a predetermined delay factor to generate a delayed input continuous-time signal, a processing block configured to determine a difference between the input continuous-time signal and the delayed input continuous-time signal, and a multiplication block configured to multiply the difference by a multiplication factor to provide the approximate differentiation of the input continuous-time signal.

In some of the embodiments disclosed herein, the multiplication factor is an inverse of the predetermined delay factor.

In some of the embodiments disclosed herein, the continuous-time delay block comprises a delay line.

In some of the embodiments disclosed herein, the delay line comprises a plurality of delay stages each configured to provide a fixed amount of delay.

In some of the embodiments disclosed herein, each delay stage comprises at least one inverter.

In some of the embodiments disclosed herein, the input continuous-time signal is represented using a plurality of continuous-time binary bit signals, and the continuous-time delay block comprises a plurality of sub-blocks operating in parallel, each of which is configured to delay one of the plurality of continuous-time binary bit signals by the predetermined delay factor.

In some of the embodiments disclosed herein, the processing block comprises an adder implemented using asynchronous logic.

Disclosed embodiments include an apparatus configured to provide an approximate integration of an input continuous-time signal. The apparatus can include a multiplication block configured to multiply the input continuous-time signal by a multiplication factor to provide an amplitude-adjusted input signal, a continuous-time delay block configured to receive a first value of an output signal of the apparatus corresponding to the first time instance and provide, at an output of the continuous-time delay block, the first value at a second time instance later than the first time instance, and a processing block configured to receive, at the second time instance, the amplitude-adjusted input signal from the multiplication block and the first value of the output signal from the output of the continuous-time delay block, and to provide a sum of the amplitude-adjusted input signal and the first value of the output signal to generate a second value of the output signal of the apparatus corresponding to the second time instance, wherein the second value of the output signal is the approximate integration of the input continuous-time signal at the second time instance.

In some of the embodiments disclosed herein, the multiplication factor is an inverse of the predetermined delay factor.

In some of the embodiments disclosed herein, the continuous-time delay block comprises a delay line.

In some of the embodiments disclosed herein, the delay line comprises a plurality of delay stages each configured to provide a fixed amount of delay.

In some of the embodiments disclosed herein, each delay stage comprises at least one inverter.

In some of the embodiments disclosed herein, the input continuous-time signal is represented using a plurality of continuous-time binary bit signals, and wherein the continuous-time delay block comprises a plurality of sub-blocks operating in parallel, each of which is configured to delay one of the plurality of continuous-time binary bit signals by the predetermined delay factor.

In some of the embodiments disclosed herein, the processing block comprises an adder implemented using an asynchronous logic circuit.

In some of the embodiments disclosed herein, the multiplication block comprises a multiplier implemented using an asynchronous logic circuit.

Disclosed embodiments include a system. The system can include an apparatus configured to provide an approximate differentiation of an input continuous-time signal. The apparatus can include a multiplication block configured to multiply the input continuous-time signal by a multiplication factor to provide a first signal, a continuous-time delay block configured to receive the first signal and to delay the first signal by a predetermined delay factor to generate a second signal, and a processing block configured to receive the first signal and the second signal, and to determine a difference between the first signal and the second signal to provide the approximate differentiation of the input continuous-time signal.

In some of the embodiments disclosed herein, the system can also include a controller configured to determine the predetermined delay factor for the continuous-time delay block and to instruct the continuous-time delay block to delay the first signal by the predetermined delay factor.

In some of the embodiments disclosed herein, the controller is further configured to determine that the multiplication factor is an inverse of the predetermined delay factor and to instruct the multiplication block to multiply the input continuous-time signal by the multiplication factor.

In some of the embodiments disclosed herein, the input continuous-time signal is represented using a plurality of continuous-time binary bit signals, and wherein the continuous-time delay block comprises a plurality of sub-blocks operating in parallel, each of which is configured to delay one of the plurality of continuous-time binary bit signals by the predetermined delay factor.

In some of the embodiments disclosed herein, the system can also include a continuous-time logic block, in communication with the apparatus, configured to receive the approximate differentiation of the input continuous-time signal to process the approximate differentiation of the input continuous-time signal.

DETAILED DESCRIPTION

Some embodiments of the present disclosure relate to implementing continuous-time differentiation and/or integration operations using simple analog components. In particular, some embodiments of the present disclosure relate to implementing differentiation and/or integration operations using one or more continuous-time delay blocks. The disclosed embodiments of differentiators and integrators can be useful in a variety of applications, including power or energy constrained applications, such as mobile applications, biomedical applications, and robotic applications.

A derivative of a signal x(t) can be computed as:

$$\frac{dx}{dt} = \lim_{\tau \to 0} \frac{[x(t) - x(t-\tau)]}{\tau}$$

Based on this relationship, the derivative of the signal x(t) can be approximated as follows:

$$y(t) = \frac{[x(t) - x(t-\tau)]}{\tau}$$

where $\tau$ denotes a finite difference in time, referred to as a time step. As $\tau$ gets smaller, y(t) would become closer to the derivative $$\frac{dx}{dt}.$$

As long as $$\frac{1}{\tau}$$

is substantially higher than the maximum rate of change of the signal x(t) (e.g., the highest frequency content of the signal x(t)), y(t) can be an accurate approximate of the derivative $$\frac{dx}{dt}.$$

Figure 1:
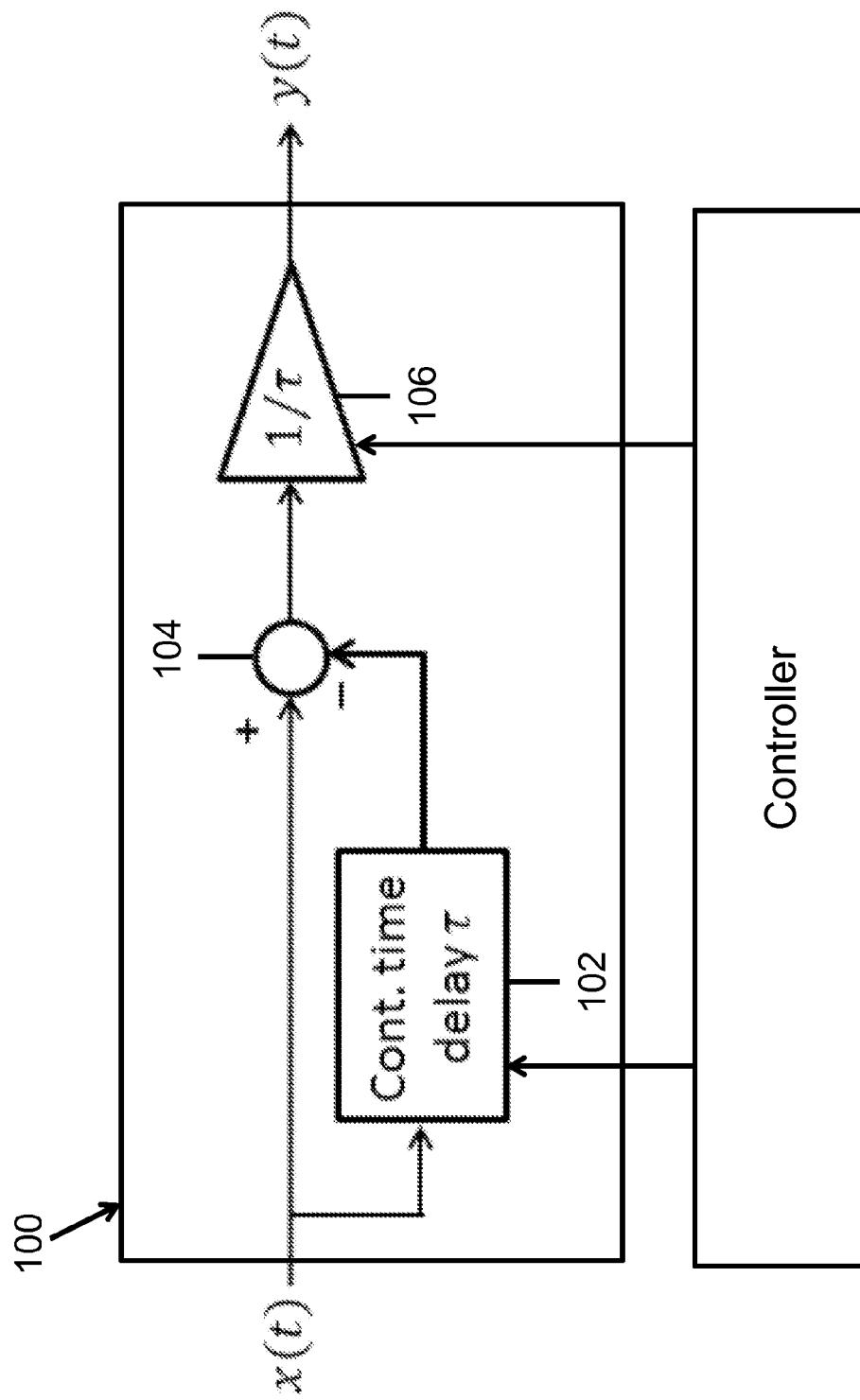
FIG. 1 illustrates a continuous-time differentiator based on a continuous-time delay block in accordance with some embodiments.

The approximate derivative y(t) can be computed from x(t) using a differentiator based on a continuous-time delay block. FIG. 1 illustrates a differentiator based on a continuous-time delay block in accordance with some embodiments. The differentiator 100 includes a continuous-time delay block 102, a processing block 104, and a multiplication or gain block 106. The differentiator 100 is configured to receive a signal x(t) and to provide an approximate derivative y(t) of the input signal x(t) as an output. The input signal x(t) is provided to the continuous-time delay block 102, which is configured to delay the signal x(t) by a predetermined amount $\tau$ and provide the delayed input signal x(t–$\tau$) to the processing block 104. The input signal x(t) is also provided to the processing block 104 directly. The processing block 104 therefore receives both the input signal x(t) and the delayed input signal x(t–$\tau$).

Subsequently, the processing block 104 is configured to compute a difference between the two signals [x(t)–x(t–$\tau$)] and provide the difference to the multiplication block 106. The multiplication block 106 is then configured to multiply the difference by a multiplication factor $$\frac{1}{\tau},$$

and provide, at the output, $$\frac{[x(t) - x(t-\tau)]}{\tau},$$

which is y(t). The differentiator 100 can be configured to control the accuracy of the approximation y(t) by controlling the size of the delay step $\tau$.

Figure 2:
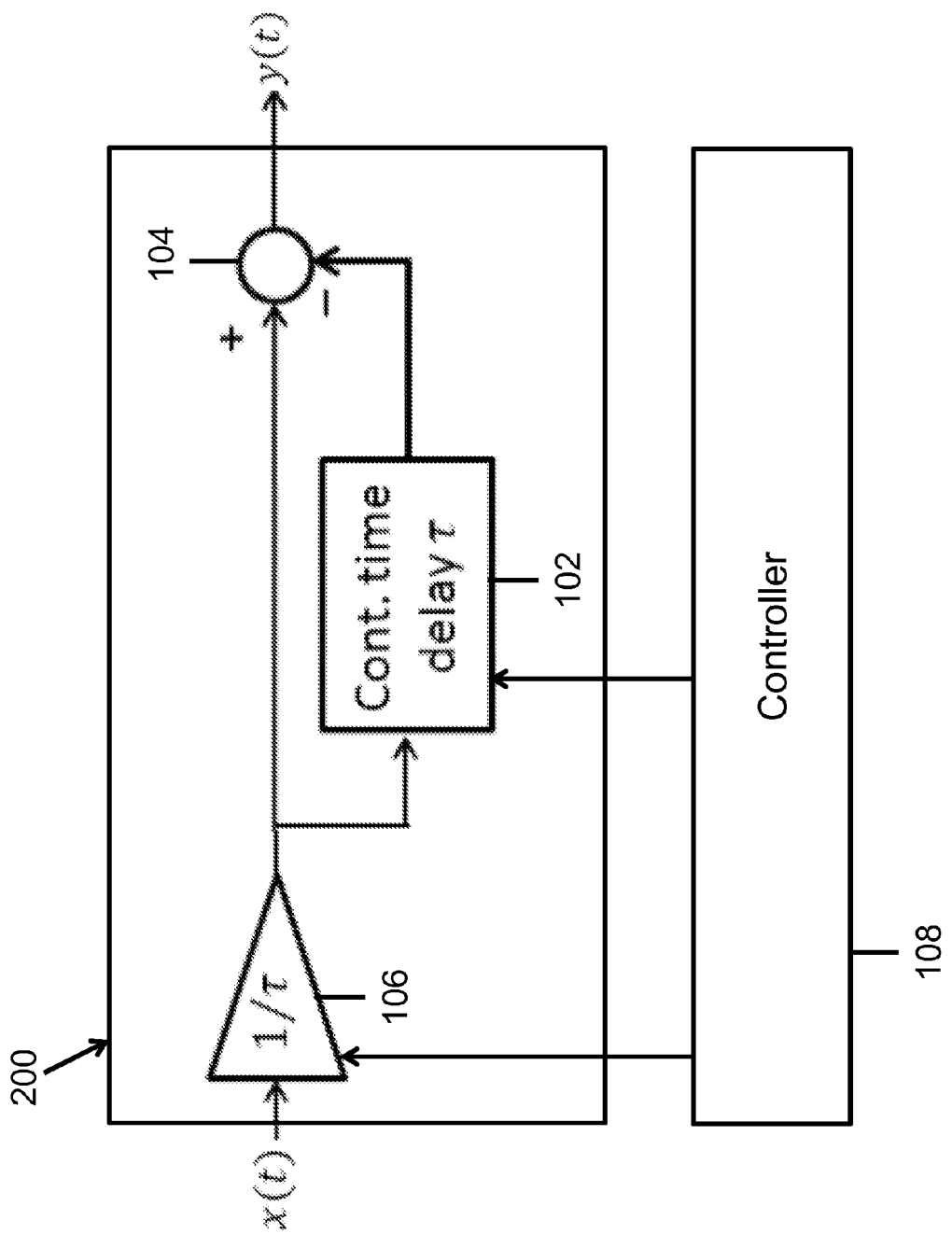
FIG. 2 illustrates an alternative continuous-time differentiator in accordance with some embodiments.

In some embodiments, the multiplication block 106 can be configured to multiply the difference between the two signals [x(t)−x(t−τ)] by a multiplication factor different from $$\frac{1}{\tau}$$

to accomplish amplitude scaling. In some embodiments, the multiplication block 106 can be moved to the input of the differentiator. FIG. 2 illustrates an alternative differentiator having the multiplication block at the input of the differentiator in accordance with some embodiments. The functionality of the differentiator 200 is substantially similar to the functionality of the differentiator 100.

In some embodiments, the differentiator 100/200 can communicate with a controller 108. In some cases, the controller 108 can be configured to control the size of the delay step τ provided by the continuous-time delay block 102. The controller 108 can receive or determine a delay step τ (e.g., a predetermined amount of delay) to be provided by the continuous-time delay block 102, and instruct the continuous-time delay block 102 to provide the predetermined amount of delay to the signal provided at the input of the continuous-time delay block 102. In some cases, the controller 108 can also be configured to control the multiplication factor used by the multiplication block 106. For example, the controller 108 can instruct the multiplication block 106 to multiply the signal provided at the input of the multiplication block 106 with a multiplication factor 1/τ or another multiplication factor in accordance with the amplitude scaling.

An integration of a signal x(t) can be computed by based on a continuous-time delay block as well. Denoting the integration of the signal x(t) as z(t), z(t) and x(t) are related as follows:

$$\frac{dz}{dt} = x(t)$$

The derivative of the signal z(t) can be approximated as follows:

$$x(t) = \frac{[z(t) - z(t - \tau)]}{\tau}$$

Therefore, the above relationship can be rearranged to show that z(t)=z(t−τ)+τx(t).

As before, as long as $$\frac{1}{\tau}$$

is substantially higher than the maximum rate of change of the signal z(t) (e.g., the highest frequency content of the signal z(t)), z(t) can be an accurate approximate of the integration of the signal x(t).

Figure 3:
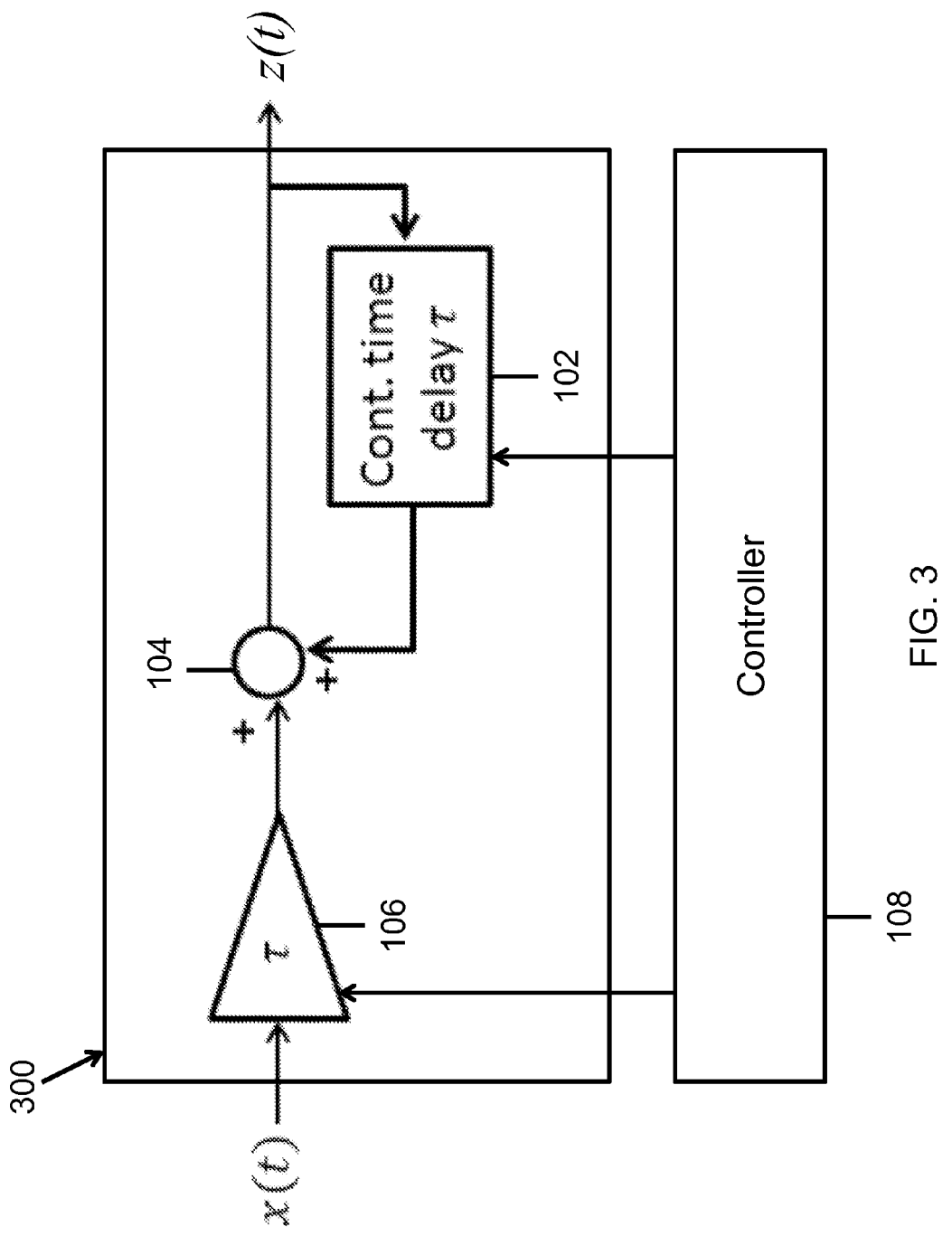
FIG. 3 illustrates a continuous-time integrator based on a continuous-time delay block in accordance with some embodiments.

This rearranged relationship can be computed using an integrator based on a continuous-time delay block. FIG. 3 illustrates an integrator implemented using a continuous-time delay block in accordance with some embodiments.

The integrator 300 can include a continuous-time delay block 102, a processing block 104, and a multiplication block 106.

The integrator 300 is configured to receive a signal x(t) and to provide an approximate integration z(t) of the input signal x(t). The input signal x(t) is received by a multiplication block 106, which multiplies the input signal x(t) by a multiplication factor τ. The multiplication block 106 subsequently provides the amplitude-adjusted input signal τx(t) to the processing block 104. On the other hand, the continuous-time delay block 102 is configured to receive an output signal of the integrator 300 and delay the received output signal by a predetermined delay factor τ to provide a delayed output signal z(t−τ) to the processing block 104. Thus the processing block 104 is configured to receive the amplitude-adjusted input signal τx(t) from the multiplication block 106 and a delayed version of the output signal z(t−τ) from the continuous-time delay block 102.

Subsequently, the processing block 104 can add the two signals τx(t) and z(t−τ) and provide the sum as the output signal z(t). In most cases, when the delay of the processing block 104 is sufficiently small (e.g., the bandwidth of the processing block 104 is high), then the delay through that block will have a negligible effect on the output.

The integrator 300 can be configured to control the accuracy of the approximation z(t) by controlling the value of the time step τ. The foregoing discussion of the integrator 300 is based on an assumption that the delay of the multiplication block 106 and the processing block 104 is substantially less than the delay of the continuous-time delay block 102, which can be easily satisfied.

Figure 4:
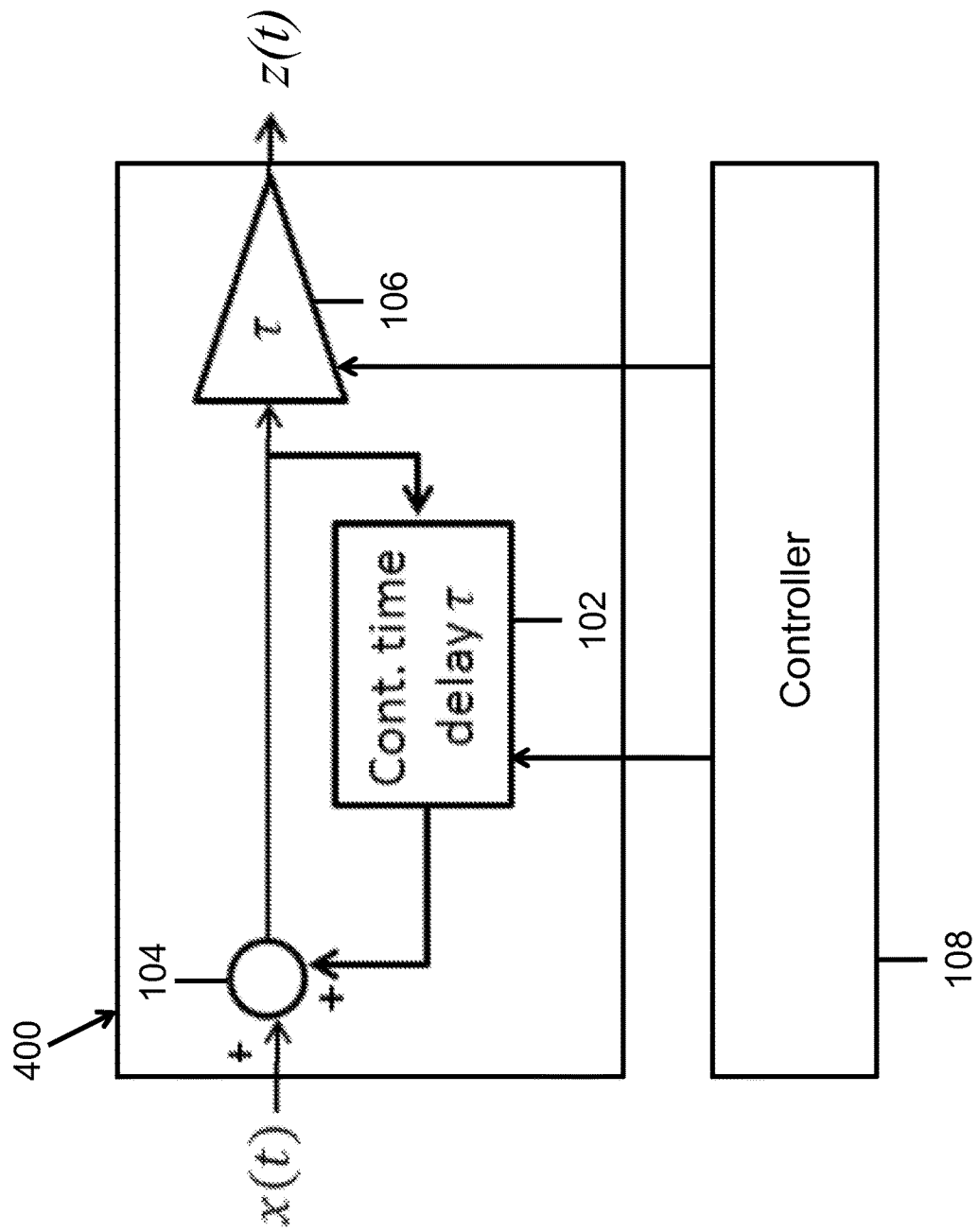
FIG. 4 illustrates an alternative continuous-time integrator implemented in accordance with some embodiments.

In some embodiments, the multiplication block 106 can be configured to multiply the sum of the input signal and the time-delayed output [x(t)+z(t−τ)] by a multiplication factor different from τ to accomplish amplitude scaling. In some embodiments, the multiplication block 106 can be moved to the output of the integrator. FIG. 4 illustrates an alternative integrator implemented having the multiplication block at the output of the integrator in accordance with some embodiments. The functionality of the integrator 400 is identical to the functionality of the integrator 300.

The system and methods of the present invention can use a variety of integration techniques. For example, the technique described in connection with FIG. 3 corresponds to a backward Euler integration technique. Other techniques can include, for example, a forward Euler integration technique. The forward Euler integration technique is described by the following equation:

z(t)=z(t−τ)+τx(t−τ).

Figure 8:
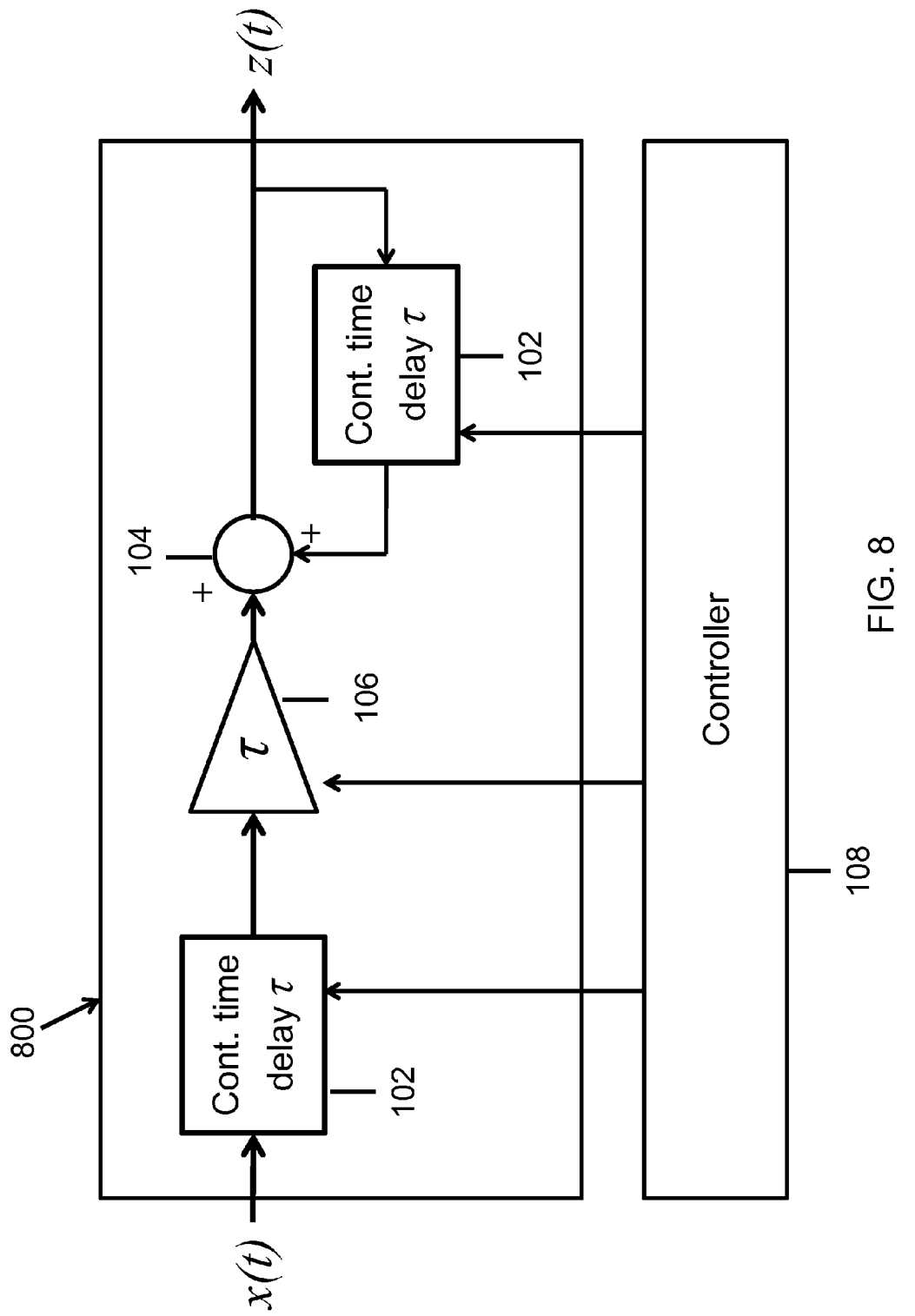
FIG. 8 illustrates an alternative continuous-time integrator implemented in accordance with some embodiments.

FIG. 8 illustrates an exemplary implementation of the forward Euler integration technique. Specifically, FIG. 8 shows two continuous-time delay blocks 102, configured to delay their input by a predetermined delay factor τ. The multiplication block is configured to multiply its input by a multiplication factor. As shown in FIG. 8, the predetermined delay factor and multiplication factor are equal to τ.

Under alternative embodiments, the predetermined delay factor and multiplication factor can have different values. In addition, the topology can be different. For example, a trapezoid integration technique can be used in the systems and methods of the disclosed invention. The trapezoid integration technique is described by the following equation:

$$z(t) = z(t - \tau) + \frac{\tau}{2}[x(t) + x(t - \tau)]$$

Figure 9:
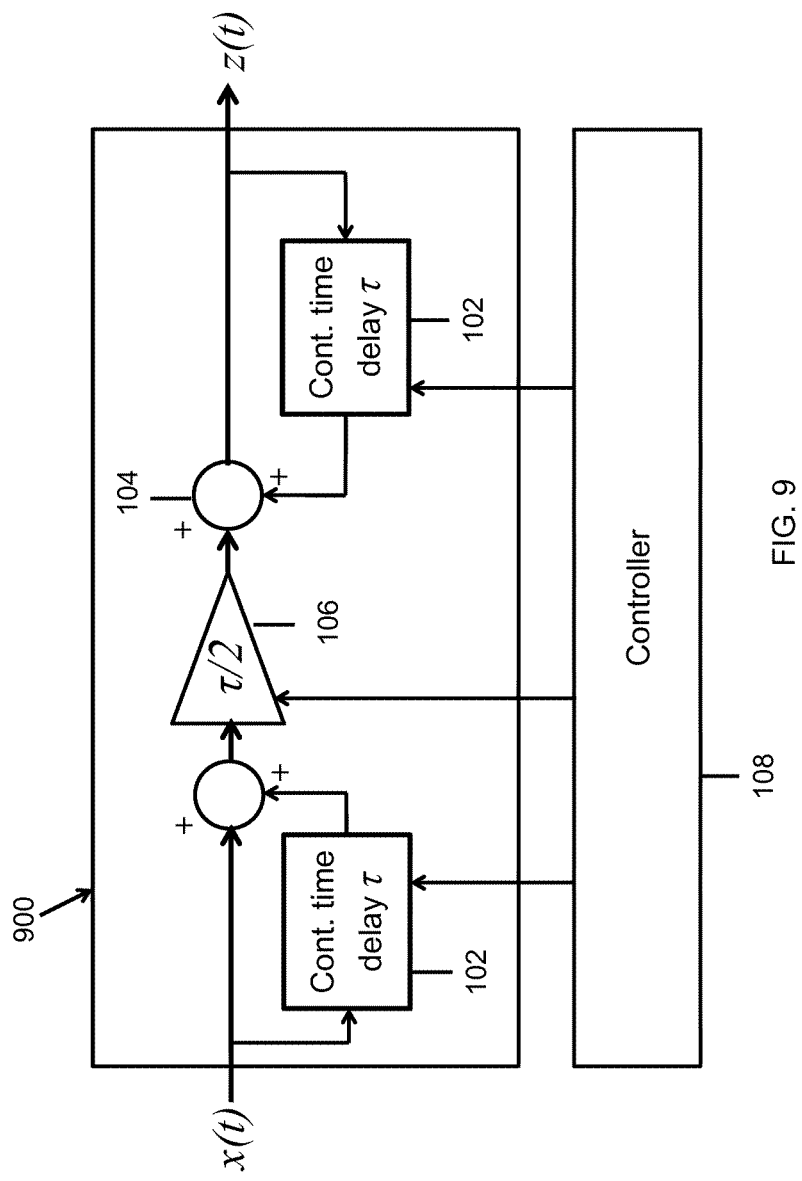
FIG. 9 illustrates an alternative continuous-time integrator implemented in accordance with some embodiments.

In this embodiment, the multiplication factor is half the predetermined delay factor. FIG. 9 illustrates an exemplary implementation of the trapezoid integration technique.

A person of ordinary skill would understand that the disclosed differentiator and integrator embodiments are exemplary, and that other implementations can be used.

In some embodiments, the integrator 300/400/800/900 can communicate with a controller 108. In some cases, the controller 108 can be configured to control an amount of delay provided by the continuous-time delay block 102. The controller 108 can receive or determine a predetermined amount of delay (e.g., the delay step τ) to be provided by the continuous-time delay block 102, and instruct the continuous-time delay block 102 to provide the predetermined amount of delay to the signal received at the input of the continuous-time delay block 102. In some cases, the controller 108 can also be configured to control the multiplication factor of the multiplication block 106. For example, the controller 108 can instruct the multiplication block 106 to multiply the signal received at the input of the multiplication block 106 by a multiplication factor $$\frac{1}{\tau}$$

or another multiplication factor in accordance with the amplitude scaling.

The disclosed differentiators 100/200 and integrators 300/400/800/900 can be used for signals in the analog domain. In some embodiments, the input signal x(t) can be represented in a voltage domain. In other embodiments, the input signal x(t) can be represented in a current domain or charge domain. For example, the signal value x(t) can be represented as a current value, not a voltage value.

Figure 5:
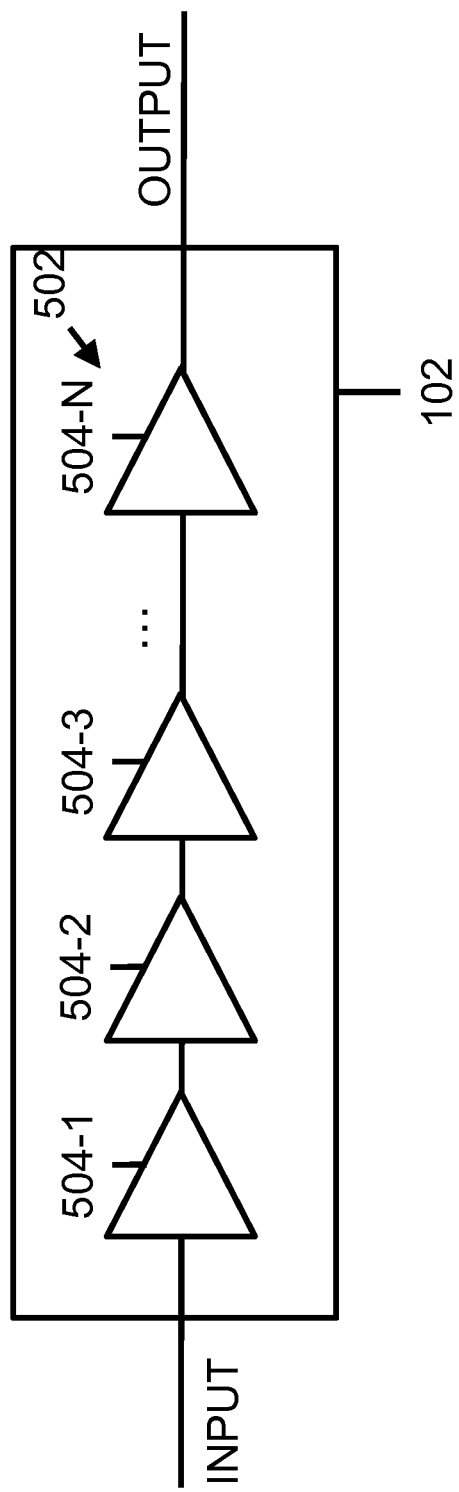
FIG. 5 illustrates a delay-line having a plurality of delay stages in accordance with some embodiments.

The continuous-time delay block 102 can include a circuit element that can introduce a predetermined delay to a signal. In some embodiments, the continuous-time delay block 102 can include a delay line having a plurality of delay stages. FIG. 5 illustrates a delay-line having a plurality of delay stages in accordance with some embodiments. The delay line 502 includes a plurality of delay stages 504-1, . . . 504-N. Each delay stage 504 can include an analog circuit, e.g. an all-pass or low-pass filter, thereby adding a finite delay to an input signal. In some embodiments, the buffer can include at least one digital inverters arranged in series. The delay from each delay stage 504 can be configured to be small enough so that the delay line 502 can handle the highest data rate expected at its input. The amount of delay per section, and the number of delays, can be varied by a controller to provide operation flexibility.

In other embodiments, the continuous-time delay block 102 can include a bucket brigade device, an inductor-capacitor ladder network, a series of cascaded resistance-capacitance (RC) network, a transmission line, and/or an active filter, e.g. of the "all-pass" or "low-pass" type, with sufficient bandwidth.

In some embodiments, the processing block 104 can be implemented using an analog signal summation block, which can be configured to add or subtract analog signals. In some cases, the analog signal summation block can be implemented using an operational amplifier. In other cases, the analog signal summation block can be implemented using current mirrors. In other cases, the analog signal summation block can be implemented using other techniques known to those skilled in the art, e.g. a resistive adder.

In some embodiments, the multiplication block 106 can be implemented using an amplifier. The amplifier can include a single-stage amplifier, a multiple-stage, cascaded amplifier, and/or a cascode amplifier. In other embodiments, the multiplication block 106 can be implemented using an operational amplifier.

Figure 6:
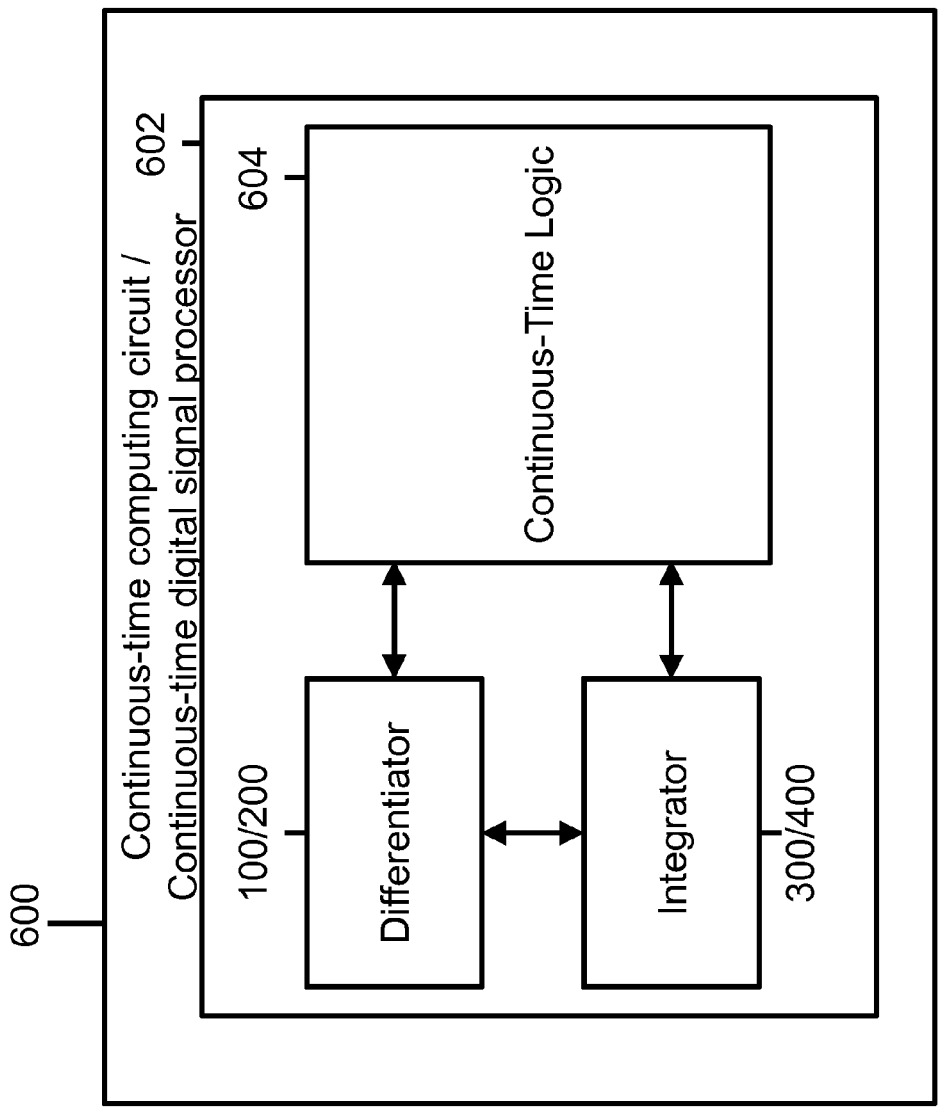
FIG. 6 illustrates a signal processing system in accordance with some embodiments.

In some embodiments, the disclosed embodiments of the differentiators 100/200 and the integrators 300/400 can be used in a continuous-time computing circuit (CT-CC) or continuous-time digital signal processor (CT-DSP). FIG. 6 illustrates a signal processing system in accordance with some embodiments. The signal processing system 600 can include a CT-CC or CT-DSP 602, which includes one or more differentiators 100/200, one or more integrators 300/400, and/or continuous-time logic 604 for processing signals provided from the one or more differentiators 100/200 and/or the one or more integrators 300/400. In a CT-CC/CT-DSP 602, a continuous-time signal x(t) can be represented using one or a plurality of continuous-time binary bit signals:

$$x(t) = \sum_{n=0}^{N-1} 2^n b_n(t)$$

where $b_n(t)$ represents a binary bit for the $n^{th}$ bit position. In the previous equation, when N=1, the continuous-time signal x(t) is represented by a single continuous-time binary bit signal "$b_0(t)$." Each bit $b_n(t)$ is a continuous-time function rather than a digital sequence used in conventional discrete-time bit streams.

Figure 7:
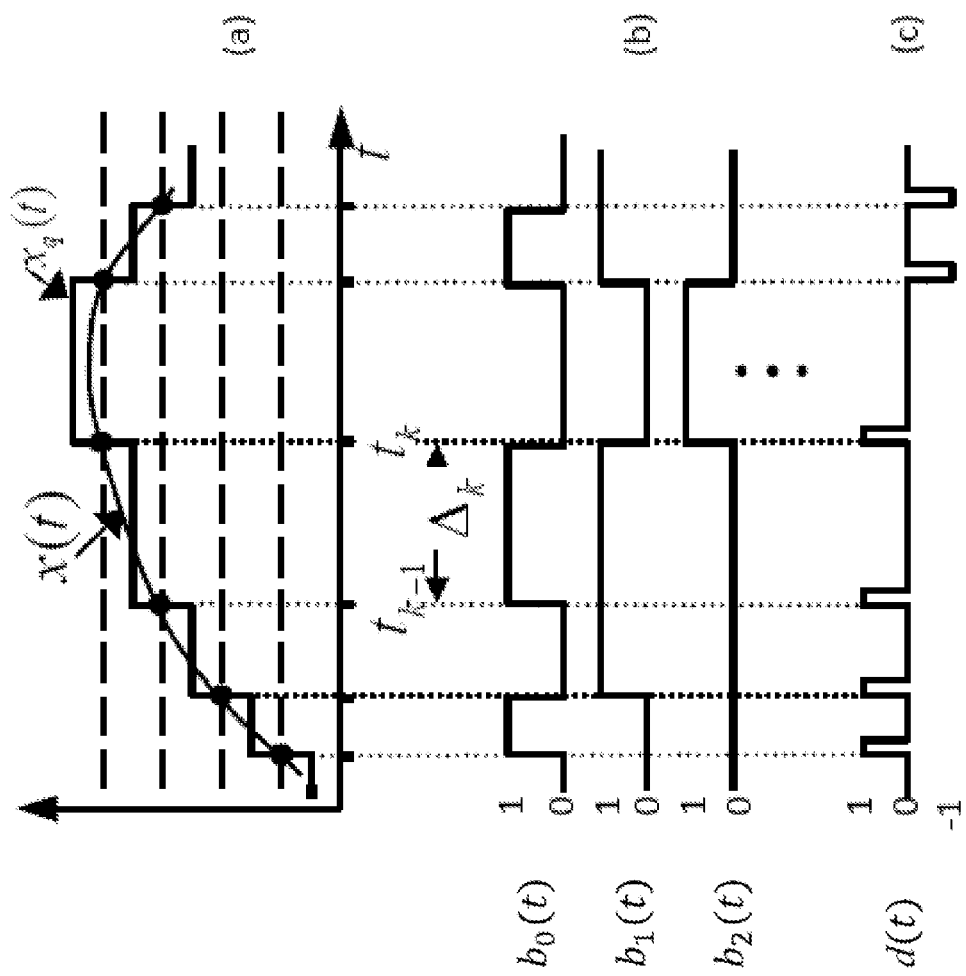
FIGS. 7(a)-7(c) illustrate a representation of a continuous-time signal x(t) under various encoding schemes in accordance with some embodiments.

In some embodiments, the continuous-time bits $b_n(t)$ can be generated from an analog input signal x(t). FIGS. 7(a)-7(b) illustrate the conversion of a continuous-time signal x(t) to a parallel set of continuous-time bits $b_n(t)$ in accordance with some embodiments. The bits $b_n(t)$ in FIG. 7(b) represent the quantized version of x(t), shown as $x_q(t)$ in FIG. 3(a). The intervals Δk between the switching instants can be an important part of the binary continuous-time representation. The CT-CC/CT-DSP 602 and its applications are described in detail in U.S. Pat. No. 7,132,972, entitled "CONTINUOUS-TIME DIGITAL SIGNAL GENERATION, TRANSMISSION, STORAGE AND PROCESSING," issued on Nov. 7, 2006, by Tsividis, which is herein incorporated by reference in its entirety.

In other embodiments, the continuous-time bits $b_n(t)$ may not result from the conversion of an analog input signal x(t). Instead, for example, the continuous-time bits $b_n(t)$ may be generated as an output of the Continuous-Time Logic 604 or an input signal from an external signal source.

When the disclosed differentiators 100/200 and integrators 300/400 are used in the CT-CC/CT-DSP 602, each wire in FIGS. 1-6 can represent vectors, with elements corresponding to individual bits $b_n(t)$, and each block in FIGS. 1-6 can be an array of blocks of the same type, or, more generally, a block that operates on its input vectors. For example, when the input signal x(t) is represented using N bits $b_n(t)$, the continuous-time delay block 102 can include an array of N delay elements, one for each bit, in parallel, producing at their output delayed bits representing the signal:

$$x(t-\tau) = \sum_{n=0}^{N-1} 2^n b_n(t-\tau)$$

In some embodiments, the continuous-time delay block 102 can be implemented in accordance with "A CONTINUOUS-TIME ADC/DSP/DAC SYSTEM WITH NO CLOCK AND ACTIVITY-DEPENDENT POWER DISSPATION," published in IEEE Journal of Solid-State Circuits, vol. 43, no. 11, pp. 2472-2481, in November 2008, by Schell and Tsividis, which is herein incorporated by reference in its entirety.

In some embodiments, when the disclosed differentiators 100/200 and integrators 300/400/800/900 are used in the CT-CC/CT-DSP 602, the processing block 104 and the multiplication block 106 can be implemented using asynchronous logic or a continuous-time (CT) filter logic in accordance with "A CONTINUOUS-TIME ADC/DSP/DAC SYSTEM WITH NO CLOCK AND ACTIVITY-DEPENDENT POWER DISSPATION," supra, which is herein incorporated by reference in its entirety. For example, the processing block 104 can be implemented using an adder and the multiplication block 106 can be implemented using a multiplier, both of which are described in the above-identified reference. The lack of synchronicity of the various signals can lead to arbitrary arrival times at the input of the adder or the multiplier. This is an issue that has been successfully handled in CT-CC/CT-DSPs, through appropriate arbitration techniques, as disclosed, for example, in the above-identified reference.

The disclosed differentiators 100/200 and integrators 300/400 in the CT-CC/CT-DSP 602 can use signals represented in one of a variety of representations. In some embodiments, the disclosed differentiators 100/200 and integrators 300/400 in the CT-CC/CT-DSP 602 can be used for signals represented using a delta-modulation representation. FIG. 7(c) illustrates a delta-modulation representation of a continuous-time signal x(t). The delta-modulation scheme can identify (1) a time instance at which the amplitude of the input signal x(t) crosses a predetermined threshold and (2) whether the signal x(t) is increasing or decreasing at that time instance. In FIG. 7(c), each pulse in d(t) indicates the time instance at which the input signal x(t) crosses a predetermined threshold, and the sign of the d(t) indicates whether the signal x(t) is increasing or decreasing at that time instance. The pulses in d(t) can be summed over time construct the quantized input signal $x_q(t)$ from d(t). The signal d(t) can be represented using two binary-valued continuous-time signals.

In some embodiments, the disclosed differentiators 100/200 and integrators 300/400/800/900 can be used for signals represented using a per-edge encoding, as disclosed in U.S. Patent Application Publication No. 2013/0057423, entitled "SYSTEMS, DEVICES, AND METHODS FOR CONTINUOUS-TIME DIGITAL SIGNAL PROCESSING AND SIGNAL REPRESENTATION," by Kurchuk et. al., which is herein incorporated by reference in its entirety. The per-edge encoding of the input signal x(t) is beneficial because the rate at which the per-edge encoded signal changes can be less than the regular binary bit representation $b_n(t)$ of the input signal x(t). This characteristic is particularly useful when the continuous-time delay block 102 is implemented using a delay line with a plurality of delay stages. Because the rate at which the per-edge encoded signal changes is low, the minimum delay τ that should be provided by the delay line can be relatively large. Therefore, the per-edge encoding of the input signal x(t) can allow the disclosed differentiators 100/200 and integrators 300/400 to accommodate a wide range of signals having a broad bandwidth. When the input signal x(t) is represented using the per-edge encoding, the processing block 104 and the multiplication block 106 can be implemented using a continuous-time logic block, as disclosed in U.S. Patent Application Publication No. 2013/0057423.

In some embodiments, the disclosed differentiators 100/200 and integrators 300/400 can replace corresponding blocks in analog computers, enabling all-digital continuous-time computation. This can be enhanced by the presence of additional digital logic and memory, to allow for programming In some embodiments, the disclosed differentiators 100/200 and integrators 300/400 can be implemented on an integrated circuit chip. In some cases, the disclosed differentiators 100/200 and integrators 300/400 implemented on the integrated circuit chip can be a part of a system on chip (SOC) or a part of a system in package (SIP). In some embodiments, the disclosed differentiators 100/200 and integrators 300/400 can be synthesized using a hardware description language, such as VHSIC Hardware Description Language (VHDL), Verilog, Bluespec, or Ruby.

Other embodiments, extensions, and modifications of the ideas presented above are comprehended and should be within the reach of one versed in the art upon reviewing the present disclosure. Accordingly, the scope of the disclosed subject matter in its various aspects should not be limited by the examples presented above. The individual aspects of the disclosed subject matter, and the entirety of the disclosed subject matter should be regarded so as to allow for such design modifications and future developments within the scope of the present disclosure. The disclosed subject matter can be limited only by the claims that follow.

I claim:

1. An apparatus configured to provide an approximate integration of an input continuous-time signal, the apparatus comprising:

a first continuous-time delay block configured to receive the input continuous-time signal and to delay the input continuous-time signal by a predetermined factor to generate a delayed input continuous-time signal;

a first processing block configured to receive the input continuous-time signal and the delayed input continuous-time signal and provide a sum of the input continuous-time signal and the delayed input continuous-time signal; and a multiplication block configured to multiply the sum of the input continuous-time signal and the delayed input continuous-time signal to provide a first continuous-time signal, wherein the first signal is an amplitude-adjusted sum of the input continuous-time signal and the delayed input continuous-time signal;

a second processing block configured to receive the first continuous-time signal and a second continuous-time signal and provide a sum of the first continuous-time signal and the second continuous-time signal; and a second continuous-time delay block configured to receive the sum of the first continuous-time signal and the second continuous-time signal and to delay the sum of the first continuous-time signal and the second continuous-time signal by the predetermined factor to generate the second continuous-time signal;

wherein the sum of the first continuous-time signal and the second continuous-time signal is the approximate integration of the input continuous-time signal;

wherein the multiplication factor is equal to the half of the predetermined delay factor.

2. The apparatus of claim 1, wherein the first and second continuous-time delay blocks comprise a delay line.

3. The apparatus of claim 2, wherein the delay line comprises a plurality of delay stages each configured to provide a fixed amount of delay.

4. The apparatus of claim 3, wherein each delay stage comprises at least one inverter.

5. The apparatus of claim 1, wherein the input continuous-time signal is represented using a plurality of continuous-time binary bit signals, and wherein the first continuous-time delay block comprises a plurality of sub-blocks operating in parallel, each of which is configured to delay one of the plurality of continuous-time binary bit signals by the predetermined delay factor.

6. The apparatus of claim 5, wherein the first and second processing block comprise an adder implemented using an asynchronous logic circuit.

7. The apparatus of claim 5, wherein the multiplication block comprises a multiplier implemented using an asynchronous logic circuit.

8. The apparatus of claim 1, wherein the input continuous-time signal is represented using a first single binary bit signal, the second continuous-time signal is represented using a second binary bit signal, the first continuous-time signal is represented using a third binary bit signal and wherein the first continuous-time delay block is configured to delay the first single binary bit signal by the predetermined delay factor.

9. The apparatus of claim 8, wherein the first and second processing blocks comprise an adder implemented using analog logic.

10. The apparatus of claim 1, further comprising a controller configured to determine the predetermined delay factor for the first continuous-time delay block and to instruct the first continuous-time delay block to delay the input continuous-time signal by the predetermined delay factor.

11. An apparatus configured to provide an approximate integration of an input continuous-time signal, the apparatus comprising:

a first continuous-time delay block configured to receive the input continuous-time signal and to delay the input continuous-time signal by a predetermined factor to generate a delayed input continuous-time signal;

a first processing block configured to receive the input continuous-time signal and the delayed input continuous-time signal and provide a sum of the input continuous-time signal and the delayed input continuous-time signal; and a multiplication block configured to multiply the sum of the input continuous-time signal and the delayed input continuous-time signal to provide a first continuous-time signal, wherein the first signal is an amplitude-adjusted sum of the input continuous-time signal and the delayed input continuous-time signal;

a second processing block configured to receive the first continuous-time signal and a second continuous-time signal and provide a sum of the first continuous-time signal and the second continuous-time signal; and a second continuous-time delay block configured to receive the sum of the first continuous-time signal and the second continuous-time signal and to delay the sum of the first continuous-time signal and the second continuous-time signal by the predetermined factor to generate the second continuous-time signal;

a controller configured to determine the predetermined delay factor for the first continuous-time delay block and to instruct the first continuous-time delay block to delay the input continuous-time signal by the predetermined delay factor;

wherein the sum of the first continuous-time signal and the second continuous-time signal is the approximate integration of the input continuous-time signal;

wherein the controller is further configured to determine that the multiplication factor is a equal to the half of the predetermined delay factor and to instruct the multiplication block to multiply the sum of the input continuous-time signal and the delayed input continuous-time signal by the multiplication factor.

* * * * *